(12) United States Patent
Marshall et al.

(10) Patent No.: US 7,541,994 B2
(45) Date of Patent: Jun. 2, 2009

(54) REFRACTIVE COMPACT RANGE

(75) Inventors: Dean R. Marshall, Tucson, AZ (US);
David J. Knapp, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 302 days.

(21) Appl. No.: 11/435,623

(22) Filed: May 17, 2006

(65) Prior Publication Data

US 2007/0268198 A1 Nov. 22, 2007

(51) Int. Cl.
*G01R 29/10* (2006.01)
(52) U.S. Cl. .................... 343/703; 343/911 R
(58) Field of Classification Search ............... 343/703, 343/911 R
See application file for complete search history.

(56) References Cited

U.S. PATENT DOCUMENTS

| | | | | |
|---|---|---|---|---|
| 2,415,352 | A * | 2/1947 | Iams | 343/783 |
| 2,640,154 | A * | 5/1953 | Kock | 343/910 |
| 4,218,683 | A | 8/1980 | Hemming | |
| 4,397,558 | A * | 8/1983 | Hill et al. | 356/521 |
| 5,001,494 | A * | 3/1991 | Dorman et al. | 343/703 |
| 6,147,809 | A * | 11/2000 | Corbasson et al. | 359/642 |
| 6,914,571 | B1 * | 7/2005 | Lemanczyk et al. | 343/703 |
| 2006/0132379 | A1 * | 6/2006 | Peterson | 343/910 |
| 2007/0035468 | A1 * | 2/2007 | Kuroda et al. | 343/911 L |

OTHER PUBLICATIONS

Hirvonen, T. et al., "Lens-Type Compact Antenna Test Range at MM-Waves", Proceedings of the 21st European Microwave Conference, (Sep. 1991), pp. 1079-1083, vol. 2, Conf. 21.

Sailysaily, J. et al., "Measuring Satellite Antennas with a Compact Hologram Test Range", IEEE Aerospace and Electronic Systems Magazine, (May 2002), pp. 13-19, vol. 17, No. 5.

Mahmoud, S.H.A., et al., Enhanced Compact Range Reflector Concept Using an R-Card Fence: Two-Dimensional Case, IEEE Transactions on Antennas and Propagation, (Mar. 2001), pp. 419-428, vol. 49, No. 3.

Lee T.-H., and Burnside, W.D., Multilayer R-Card Fence Design for Ground Bounce Reduction, IEEE Antennas and Propagation Society International Symposium, 2003, (Jun. 2003), pp. 804-807.

Chang, D.-C., et al., Compact Antenna Test Range Without Reflector Edge Treatment and RF Anechoic Chamber, IEEE Antennas and Propagation Magazine, (Aug. 2004), pp. 27-37, vol. 46, No. 4.

(Continued)

*Primary Examiner*—Trinh V Dinh
*Assistant Examiner*—Dieu Hien T Duong
(74) *Attorney, Agent, or Firm*—Renner, Otto, Boisselle & Sklar, LLP

(57) ABSTRACT

A radio-frequency-device test range (the Refractive Compact Range) includes a physical space having a source zone for placing an antenna or array of antennas, and a test zone for placing a sensor or other device to be tested. A lens and an apodizer are placed in the physical space between the source zone and the test zone. The lens serves to collimate radiated energy emanating from the antenna toward the test zone. The lens may have a surface treatment, such as an anti-reflective coating or a surface pattern, on one or both surfaces. The apodizer functions to keep energy from diffracting off the edge of the lens and getting into the field of view (the test zone). The sensor or other device to be tested may be placed on a moveable mount to allow it to be moved, to simulate relative movement of the device and a radio frequency source, such as radiated by an antenna.

12 Claims, 4 Drawing Sheets

OTHER PUBLICATIONS

Hsiao, Y.-T., et al., Radiation Performance Improvement of Microstrip Antennas by a Mounted Horn and R-Card for the Car Communication Applications, IEEE Antennas and Propagation Society International Symposium, 2004, (Jun. 2004), pp. 1038-1041.

* cited by examiner

REFRACTIVE COMPACT RANGE

BACKGROUND OF THE INVENTION

1. Technical Field of the Invention

This invention relates generally to systems and methods for testing devices utilizing radio frequency signals.

2. Description of the Related Art

Performing testing on devices utilizing radio frequency signals, for example radar sensors or antenna systems, may involve outdoor testing, in controlled conditions and/or in large buildings, under conditions simulating actual use of the antenna. However, testing outdoors or in a large building under controlled conditions is often impractical and/or expensive, and thus smaller indoor test ranges are often desired and used for testing.

The simplest type of prior art indoor testing facility involves surrounding an interior space with radar-absorbing material, and relying on direct illumination of a sensor by an antenna or antenna array in performing testing. The sensor may be rotated and/or moved in order to examine the effect of orientation and movement on antenna performance. Such a direct illumination test facility has the disadvantage of requiring a large interior space, as well as a significant quantity of radar-absorbing material.

Another type of prior art indoor test range for testing sensors (a compact range) uses one or more curved metal mirrors (or curved shapes coated with metal) illuminated by one or more antennas to collimate the energy and achieve the same effect on a test zone as would be achieved by a far field source (as in an outdoor range). The use of mirrors reduces the size of the test range, relative to ranges without metal mirrors. However, such indoor test ranges have a limited field of regard (nominally about seven to ten degrees) which limits the field of regard for the sensor. This limitation on the field of regard for the sensor is a severe limitation for performing hardware in the loop testing (also known as HWIL, HIL, or HITL testing) against targets generated by an array of antennas. Also, an expensive high quality reflective mirror may be required to achieve a high level of performance. A high quality reflector dish requires an edge treatment (to reduce energy bouncing off the edge of the mirror and mixing—out of phase—with the direct reflection from the surface). The edge treatment of the mirror has to handle not only the diffraction effects of direct illumination, but the diffraction effects of energy traveling along the surface of the mirror to the edge. In order to achieve larger angular coverage with a reflective mirror, extremely expensive custom designs must be resorted to, and even then there are performance limitations.

From the foregoing it will be seen that improvements are possible in the field of radio frequency test facilities, especially when applied to HWIL.

SUMMARY OF THE INVENTION

According to an aspect of the invention, a test range involves a lens between a radio frequency source zone, where a radio frequency energy source such as an antenna or array of antennas is located, and a test zone where a device under test is placed. The lens collimates the energy emitted by an antenna or array of antennas from the source to provide a uniform radiated field in the test zone.

According to another aspect of the invention, a lens for bending radio frequency radiation is used in conjunction with a radially symmetric apodizer that prevents diffraction from the edge of the lens. The lens is an aspheric lens tailored to the configuration of the antenna array and requirements of the test zone. For wideband applications an aspheric achromat lens, an apochromat lens, or even a superachromat lens may be utilized.

According to yet another aspect of the invention, a radio frequency test range includes: a physical space that includes a source zone for placing an antenna, and a test zone for placing a device to be tested; a lens between the source zone and the test zone; and an apodizer placed between the source zone and the test zone. The lens collimates the energy emitted by the antenna or other source onto the test zone. The apodizer greatly reduces destructive diffractive interference patterns from reaching the test zone by blocking the energy from reaching the edge of the lens. The R-Card apodizer may be implemented either as a stand-alone element or incorporated into the surface of the lens itself. Likewise, the lens may incorporate an anti-reflection design that will consist of either a surface coating (which may actually be part of an apodizer incorporated into the lens surface) or a surface treatment to the lens (e.g. a Chebushev pattern or a controlled psudorandom etching of the surface).

According to still another aspect of the invention, a method of testing a device in a radio frequency field includes the steps of: placing a lens and an apodizer between a source zone and a test zone; placing an antenna in the antenna zone; placing the device in the test zone; directing energy emitted from the antenna to the test zone, wherein the directing includes passing the energy onto the lens and the apodizer; and monitoring the device for energy received.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale.

DETAILED DESCRIPTION

A radio-frequency-device test range includes a physical space having a source zone for placing an antenna or array of antennas, and a test zone for placing a sensor or other device to be tested. A lens and an apodizer are placed in the physical space between the source zone and the test zone. The lens serves to collimate the energy emanating from the antenna/antenna-array toward the test zone. The lens may be an aspheric lens. The lens may have a surface treatment, such as an anti-reflective coating or a surface pattern, on one or both surfaces. The apodizer functions to keep energy from diffracting off the edge of the lens and getting into the field of view (the test zone). The apodizer may be a resistance (R-Card) fence. The sensor or other device to be tested may be placed on a moveable mount to allow it to be moved, to simulate relative movement of the device and a radio frequency source, such as an antenna. The test zone for the system may have at least a 30 degree field of regard. The field intensity in the test zone may be uniform to within 5% or less over the test zone. The signal within the test zone may be in phase to within 20 degrees or less. The test range may be useful for testing in X-band or Ka-band radiation, or more broadly radiation from about 2 GHz to 110 GHz.

Figure 1:
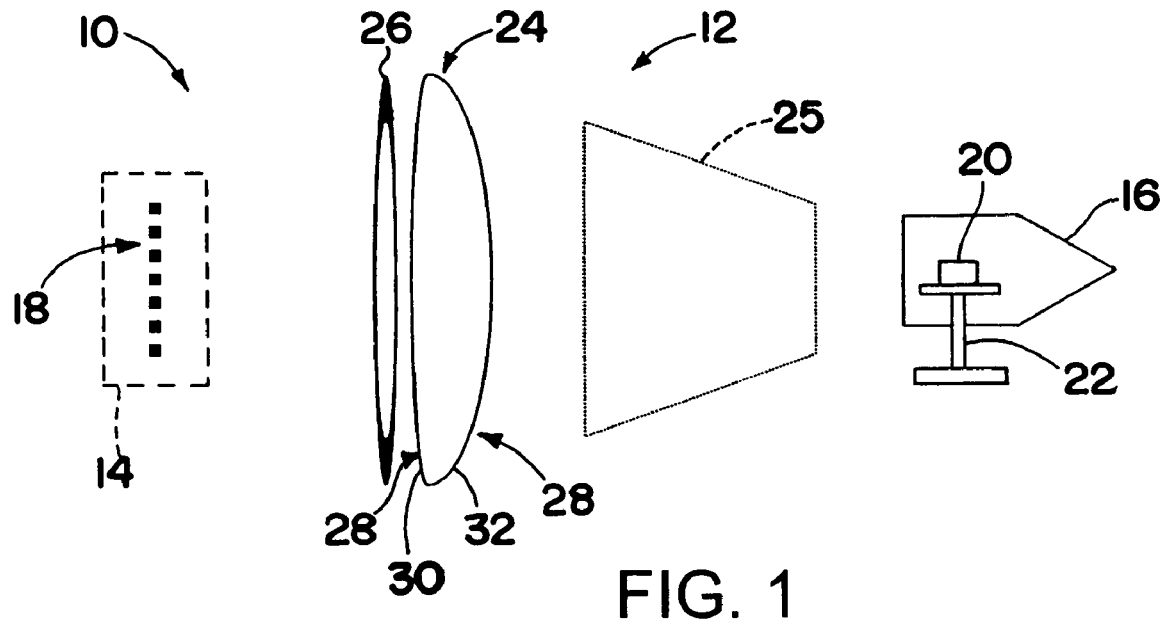
FIG. 1 is a schematic view of a test range in accordance with an embodiment of the present invention.

FIG. 1 shows a test range 10 for testing a device or devices with radio frequency energy. The test range 10 includes a physical space 12 for placing the equipment and performing the testing. The physical space 12 may be surrounded with a suitable radar-absorbing material.

The term radio frequency energy is defined herein to refer to the band of the frequency spectrum that includes 2 GHz to 110 GHz. This portion of the electromagnetic spectrum includes millimeter waves and microwaves, as well as portions of the radio band. The physical space includes a source zone 14 and a test zone 16. An antenna or array of antennas 18 is placed in the source zone 14. The term "antenna," as used herein, is defined so as to include arrays of antennas, in addition to single antennas. The antenna 18 may be an electronic steerable array (ESA) antenna, to give one example. Many other sorts of antennas may be arranged in suitable antenna arrays.

A device under test 20 is placed in the test zone 16. The antenna 18 is used to emit radio frequency energy to test the response of the device 20. The device 20 may be any of a variety of suitable devices for which information regarding response to radio frequency (RF) signals is desired. Examples of such devices include sensors and antennas such as, but not limited to, scanning devices, radiometers, radar systems, electronic warfare systems, GPS systems, communication sensors and angle of arrival systems.

The device 20 is placed on a platform or table 22 that can be used to move the device 20 in any of a variety of ways. Such platforms (or tables) may be commercially-available motion simulators, such as three degree of freedom tables available from Acutronic USA of Pittsburgh, Pa. Another suitable device is a positioner designed for performing selected antenna cuts (e.g., Az/El (azimuth over elevation) cuts, coordinated cuts, or even a 4-axis system that provides control of roll, pitch, yaw and linear radial motion). The platform 22 may be used, for example, to translate, tilt, rotate, or otherwise move the device under test 20 at either high rates of speed or precisely controlled pattern cuts. This allows characterizing the device or testing it in a variety of motions corresponding to movements that the device under test 20 may undergo in actual use. The platform 22 may have any of a variety of configurations, from a tower to a pylon, with or without a turntable/3-DOF Table/Positioner to allow the device under test 20 to be rotated.

A lens 24 and an apodizer 26 are located in the physical space 12 between the source zone 14 and the test zone 16. The lens 24 serves to collimate radiated energy emanating from the antenna 18, through a field of regard 25, toward the test zone 16. The lens 24 may have any of a variety of suitable shapes to accomplish the purpose of focusing the radiated energy. The lens 24 may be an aspheric lens, a lens with surfaces that have a profile that is neither a portion of a sphere nor of a circular cylinder. The lens 24 may have other suitable shapes and/or characteristics, for example being a monochromat lens, an acromatic lens, an apochromat lens, or a superchromat lens.

In the example given (for X-band and/or Ka-band) the lens 24 may have a diameter of about 1.5 meters (5 feet) to about 3 meters (10 feet). The lens 24 may be made of any of a variety of materials. Such materials include a variety of ceramic or composite materials, including materials suitable for use in radomes. Another broad category of suitable materials is suitable plastics that are homogeneous enough to have substantially uniform radiation transmission properties. Glass may also be usable for the lens 24, although glass is heavy and relatively difficult to work with. An example of a specific suitable material for the lens is the material sold as ECHOSORB.

Figure 2:
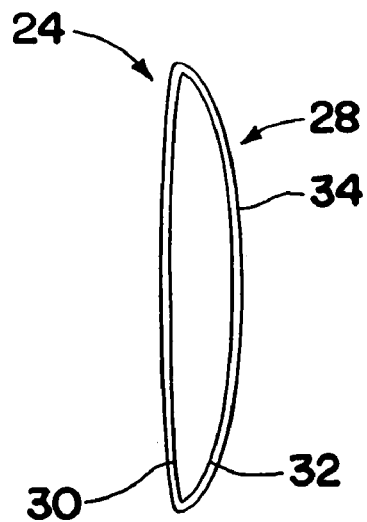
FIG. 2 is a cross-section schematic side view of an embodiment of an aspheric lens for use with the test range of FIG. 1.

The lens 24 may have a surface treatment 28 on one or both of its surfaces 30 and 32. In one embodiment, shown in FIG. 2, the surface treatment may be an anti-reflective coating 34. The coating 34 increases the brightness of the lens 24 by reducing the amount of incident radiation that is reflected by the lens 24. This increases the amount of incident radiation that is directed to the test zone 16.

The material for the anti-reflective coating 34 may include layers of dielectric materials with different indices of refraction and thicknesses, in a manner similar to that of optical anti-reflection coatings. The materials are generally any dielectric with the suitable electrical and mechanical properties. The materials for the anti-reflective coating may be similar to materials that are used in R-Card fences (described further below).

The coating 34 may be placed on the lens 24 as part of the manufacturing process for making the lens 24. Alternatively, the coating 34 may be added as a layer on one or both of the surfaces 30 and 32 after fabrication of the lens 24.

Figure 3A:
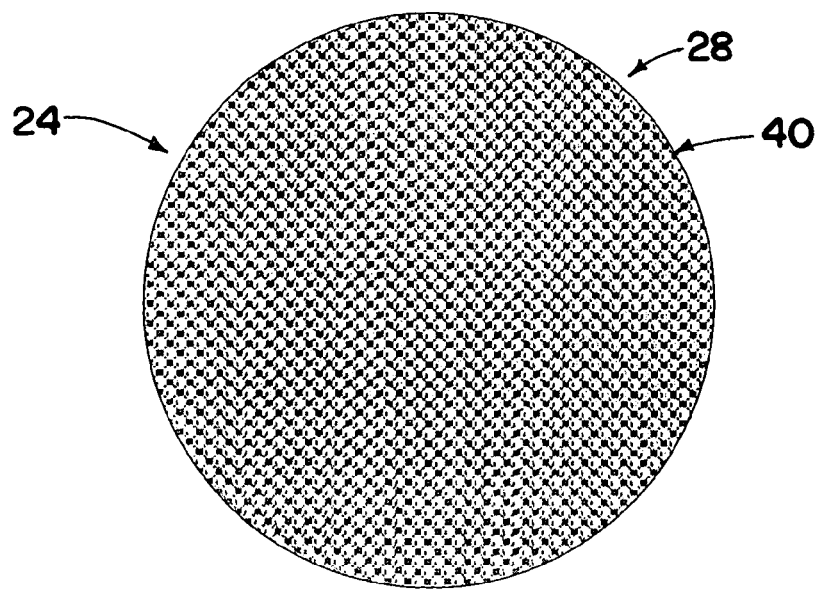
FIGS. 3A and 3B are front views of patterned aspheric lenses for use with the test range of FIG. 1.
Figure 3B:
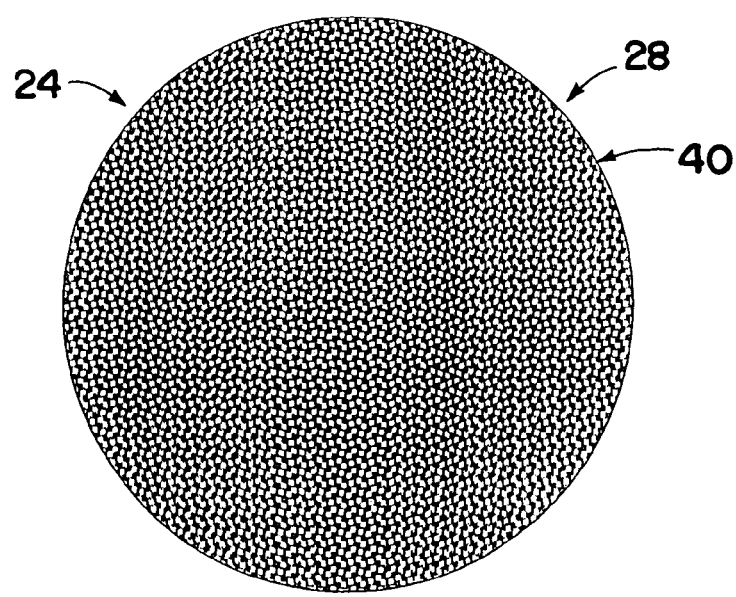

As an alternative to the use of the coating 34, a decrease in reflectiveness may be achieved by putting a surface pattern 40 on the surfaces 30 and/or 32. FIGS. 3A and 3B show two examples of such patterns. The phrase "surface pattern" is used herein to broadly refer to a controlled closely-spaced pattern introduced onto a surface. The surface pattern 40 would have a spacing dense enough so that there are many pattern elements per wavelength of incident energy. The pattern 40 may allow energy that is normally reflected from the surfaces 30 and/or 32 to interfere with itself in such a manner as to get canceled out. This reduces the amount of energy lost in reflections at the surfaces 30 and 32 of the lens 24. One example of the pattern 40 is a series of dimples placed on the surfaces 30 and 32. Another example is a Chebyshev pattern. The pattern 40 may be etched into the lens, or may be otherwise suitably formed.

The apodizer 26 functions to keep incident radiated energy from bouncing off the edge of the lens 24 and getting into the test zone. The apodizer 26 may include resistive sheets (R-cards) that are arrayed so as to make an R-card fence along the perimeter of the apodizer 26. The apodizer 26 is different from prior R-card fences in that the apodizer 26 may be substantial radially symmetric, with the apodizer 26 selectively preventing radiated energy from passing through along an outer edge. In contrast, prior art R-card fences used to prevent or attenuate reflected energy were straight fences.

Without the apodizer 26 being present, destructive interference patterns from the edge of the lens 24 degrade the signal at the test zone 16, such as by creation of Fresnel zones. This results in variations in signal amplitude in the test zone 16, rather than the more desired smooth intensity. Essentially, it is desirable to remove the edges of the lens 24 as re-radiating surfaces, by use of the apodizer 26.

The lens 24 and the apodizer 26 may be integrated into a single device. Alternatively, the lens 24 and the apodizer 26 may be separate items.

The test range 10 provides good test characteristics. The test zone 16 may be much larger than that for reflective test ranges. For example, the test zone 16 may be a cylinder at least 30 cm in diameter and 30 cm deep, with at least a 30 degree field of regard. It will be appreciated that a larger test zone allows for more movement of devices under test, as well as testing of larger devices.

The field intensity in the test zone 16 may be uniform to within 5% over the test zone. The signal within the test zone 16 may be in phase to within 20 degrees. These are both significant improvements in characteristics over such a large test zone, relative to the characteristics of reflective test ranges.

Thus the test zone 16 may have a volume of at least 21 liters, with a field intensity uniform to within 5%, and the signal in phase to within 20 degrees. It will be appreciated that these values are only examples, and the volume of the test zone 16, and the degree to which field intensity uniformity and signals are in phase may vary from the values given.

The test range 10 may be used, for example, in Ka-band radiation (27 to 40 GHz) and/or X-band (8 to 12 GHz). It will be appreciated that devices allowing for compactness of a test range are of greater importance as the frequency increases. This is because the items being tested are generally much larger at higher frequencies when measured in wavelengths than those at lower frequencies (e.g., the wavelength of 10 GHz energy is 3 cm while the wavelength of 30 GHz is 1 cm, which means that a disk 9 cm in diameter has a 3 wavelength diameter at 10 GHz but a diameter of 9 wavelengths at 30 GHz).

In configuring the test range 10, the lens 24 and the apodizer 26 will be suitably placed relative to the antenna 18 (in the source zone 14) and the test zone 16 so as to collimate the energy emitted by the antenna 18 into the test zone 16. The device under test 20 may be secured to the movement platform 22, and moved within the test zone 16. During the testing the response of the device under test 20 to the emitted radiated energy is measured. These measurements may be used for any of a variety of purposes. For example, the response of the sensor under various movement or vibration environments may be measured in a controlled, repeatable manner.

Figure 4:
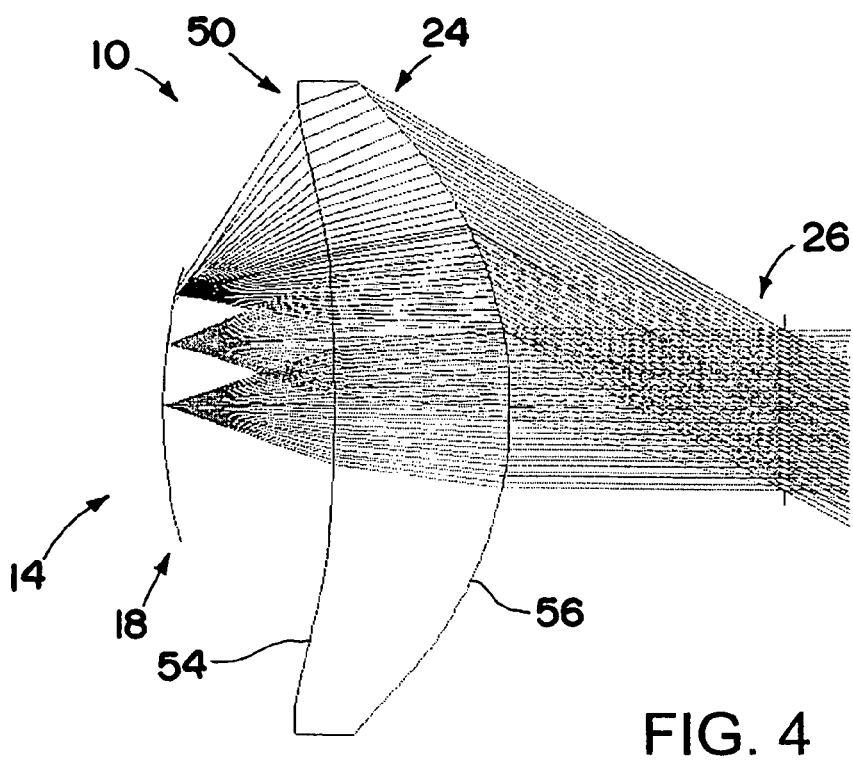
FIG. 4 is a cross-section side view of a representative embodiment aspheric lens for use with the test range of FIG. 1.
Figure 5:
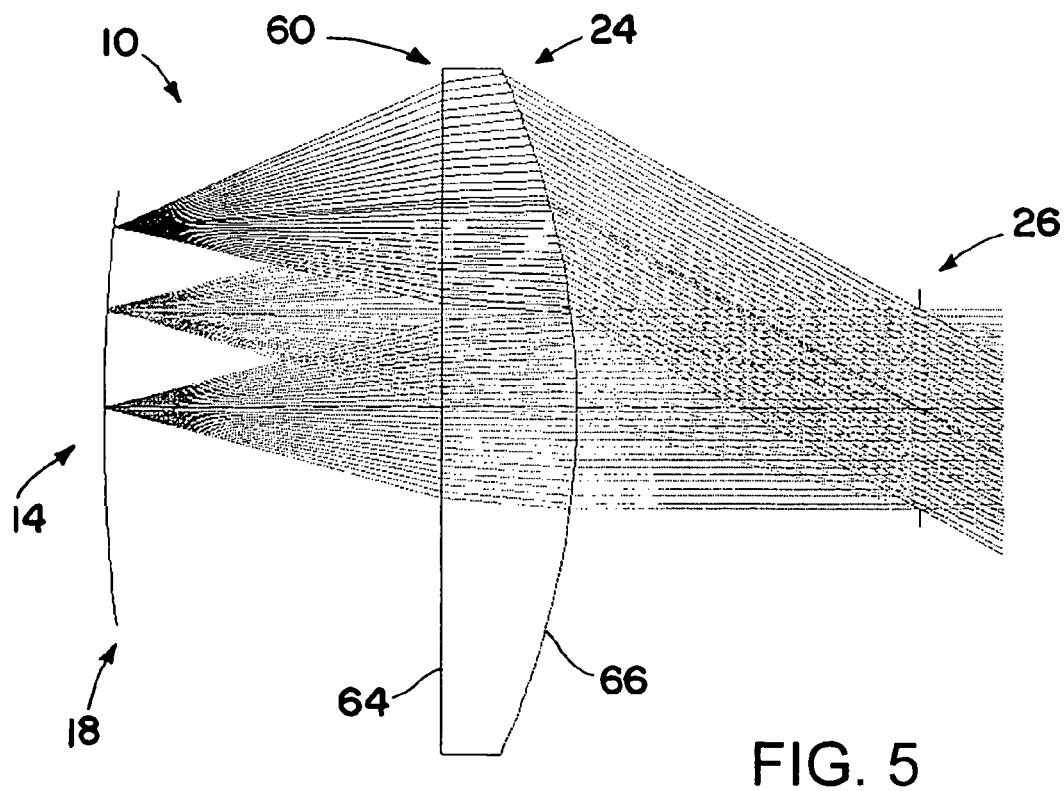
FIG. 5 is a cross-section side view of a second representative embodiment aspheric lens for use with the test range of FIG. 1.

FIGS. 4 and 5 show a pair of possible configurations for the lens 24. FIG. 4 shows an embodiment of the lens 24 that is a concave-convex lens 50, having a concave surface 54 facing the source zone 14, and a convex surface 56 facing the test zone 16. FIG. 5 illustrates a plano-convex lens 60, having a substantially planar surface 64 facing the source zone 14, and a convex surface 66 facing the test zone 16. The lenses 50 and 60 may be configured by use of a ray-tracing computer program, for example by tracing rays out from a desired size of test zone, and selecting a lens configuration to bend the rays to a desired source location and configuration.

It will be appreciated that any of a variety of suitable lenses may be configured based on a number of factors, such as the relative locations of the source zone 14 and the test zone 16, the configuration of the antenna 18, the characteristics of the material for the lens 24 (in particular the index of refraction for the material—a material having an index of refraction of 3 is used for the lenses 50 and 60), the wavelength of the radiated energy to be emitted, and the desired size and configuration for the test zone 16. To give just one example, a double convex lens may be a possibility.

FIGS. 6-9 illustrate multipart lens configurations for various embodiments of the lens 24. The embodiments shown in FIGS. 6-9 are configured to collimate multiple wavelengths of radiation into a test zone. The embodiments in FIGS. 6-9 are thus suitable for wideband use, involving sources that emit multiple wavelengths of radiation. This is in contrast to the monochromatic lenses described above.

Figure 6:
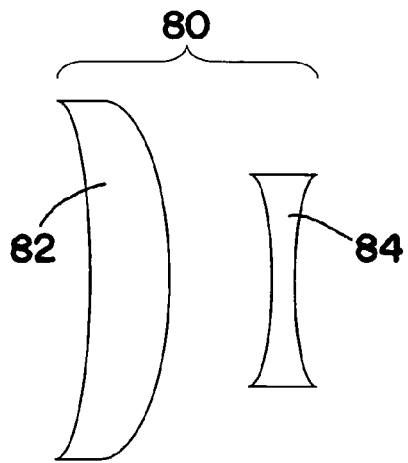
FIG. 6 is a schematic view of one embodiment of an achromat lens usable with the test range of FIG. 1.

FIG. 6 illustrates an acromat lens 80 having a pair of individual lenses 82 and 84 operatively coupled together. The lenses 82 and 84 have different respective indices of refraction, and together the lenses 82 and 84 collimate a pair of different wavelengths from the source antenna 18 to the test zone 16. The lenses 82 and 84 may be joined together in any of a wide variety of possible ways, for example being adhesively bonded together. Alternatively, the lenses 82 and 84 may be separated in space, but both attached to a single frame.

Figure 7:
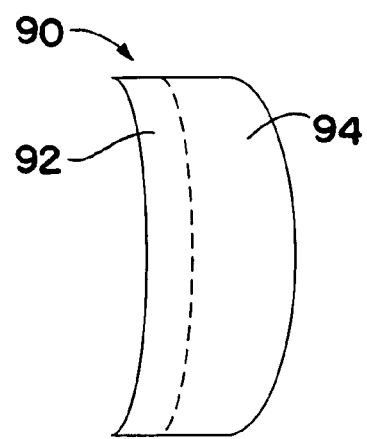
FIG. 7 is a schematic view of another embodiment of an achromat lens usable with the test range of FIG. 1.

FIG. 7 shows an alternative achromat lens 90 in which the materials with different indices of refraction are portions 92 and 94 of a single lens. The portions 92 and 94 may be permanently combined together by suitable bonding and/or melding of the two materials.

Figure 8:
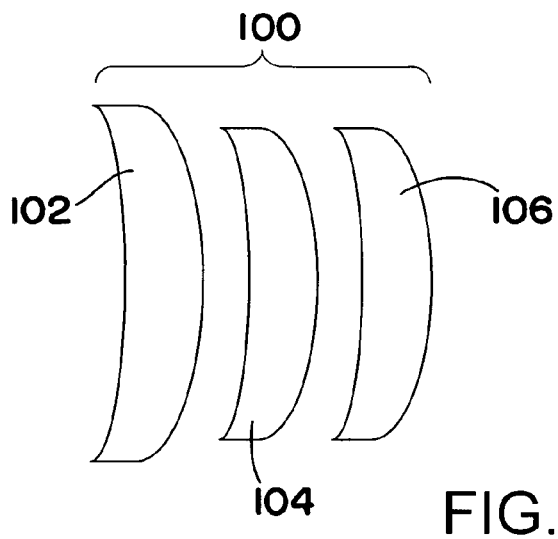
FIG. 8 is a schematic view of an embodiment of an apochromat lens usable with the test range of FIG. 1.
Figure 9:
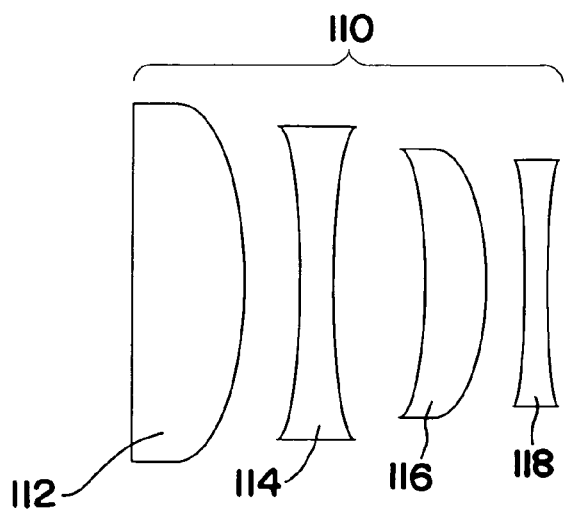
FIG. 9 is a schematic view of an embodiment of a superachromat lens usable with the test range of FIG. 1.

FIGS. 8 and 9 show extensions of the wideband concept. FIG. 8 illustrates an apochromat lens 100, including three lenses or portions 102, 104, and 106 with different indices of refraction. The apochromat lens 100 may collimate at least three wavelengths of radiation. FIG. 9 shows a superachromat lens 110 with four lenses, portions, or components 112, 114, 116, and 118. The portions 112-118 may have different indices of refraction, and may have different shapes.

It will be appreciated that the lenses 100 and 110 may have their individual components fused together to form a single lens having portions with different indices of refraction, as is shown in the achromat lens 90 (FIG. 7).

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A radio frequency test range comprising:
a physical space that includes a source zone, and a test zone for placing a device to be tested;
an aspheric lens between the source zone and the test zone;
an apodizer placed between the source zone and the lens; and
an array of antennas in the source zone;
wherein the lens collimates energy emitted by the array of antennas into the test zone;
wherein the apodizer is located relative to the lens such that the apodizer prevents radiation emitted from the source zone from reaching an edge of the lens; and
wherein the apodizer at least reduces destructive interference patterns in the energy reaching the test zone by removing the edge of the lens as a re-radiating surface.

2. The test range of claim 1, wherein the lens includes a dielectric material.

3. The test range of claim 1, wherein the lens includes a composite material.

4. The test range of claim 1, wherein the lens includes a plastic material.

5. The test range of claim 1, wherein the lens has an anti-reflection surface treatment on at least one surface.

6. The test range of claim 5, wherein the surface treatment includes a surface coating.

7. The test range of claim 6, wherein the surface coating includes layers of dielectric materials with different indices of refraction and thickness.

8. The test range of claim 5, wherein the surface treatment includes a surface pattern.

9. The test range of claim 1, wherein the apodizer is a resistance card fence apodizer That includes resistive sheets.

10. The test range of claim 1, wherein the apodizer is substantially radially symmetric.

11. The test range of claim 1, further comprising a movement platform configured to allow movement of a device in the test zone.

12. The test range of claim 1, wherein the lens is a multipart lens with different parts having different respective indices of refraction.

* * * * *